United States Patent

Wheable et al.

[11] Patent Number: 4,564,831
[45] Date of Patent: Jan. 14, 1986

[54] ANALOG TO DIGITAL CONVERTERS FOR CONVERTING A PLURALITY OF DIFFERENT INPUT SIGNALS

[75] Inventors: Desmond Wheable; Michael J. Attwood, both of Basingstoke, England

[73] Assignee: Transamerica Delaval Inc., Lawrenceville, N.J.

[21] Appl. No.: 505,078

[22] Filed: Jun. 16, 1983

[30] Foreign Application Priority Data

Jul. 2, 1982 [GB] United Kingdom ............... 8219200

[51] Int. Cl.$^4$ ............................................ H03K 13/17
[52] U.S. Cl. ..................... 340/347 AD; 340/347 M; 340/347 CC; 340/347 SH; 328/158; 364/574; 364/575; 364/178
[58] Field of Search ................. 340/347 SH, 347 AD, 340/347 M; 328/151, 158; 307/353; 358/138, 261; 364/483, 574, 575, 178

[56] References Cited

U.S. PATENT DOCUMENTS 3,879,724 4/1975 McDonald .................. 340/347 AD
4,073,009 2/1978 Andow et al. ................. 364/483 X
4,308,098 12/1981 Neuner et al. .......... 340/347 AD X
4,345,311 8/1982 Fielden ........................... 324/142 X

OTHER PUBLICATIONS

The Engineering Staff of Analog Devices, Inc., Analog–Digital Conversion Handbook, 6/1972, pp. I-30 & I-31; II-46 to II-51.

Primary Examiner—T. J. Sloyan
Attorney, Agent, or Firm—Benoit Law Corporation

[57] ABSTRACT

An analog to digital converter apparatus arranged to convert a plurality C (=4) of different input signals to digital representations thereof. The apparatus comprises a multiplexer arranged sequentially to couple each of the 4 input signals to a fast a-to-d converter (such as a successive approximations converter) at a rate such that each input signal is coupled N (=8) times in a period M (=20 m secs) of an a.c. series mode interfering signal (at 50 Hz) and at equal time intervals M/N (20/8=2.5 m secs). The N (=8) digital values of each input signal are averaged to provide at the end of a conversion period a digital value for each of the 4 input signals (C) which is the mean magnitude of the signal during the 20 m sec period (M).

5 Claims, 2 Drawing Figures

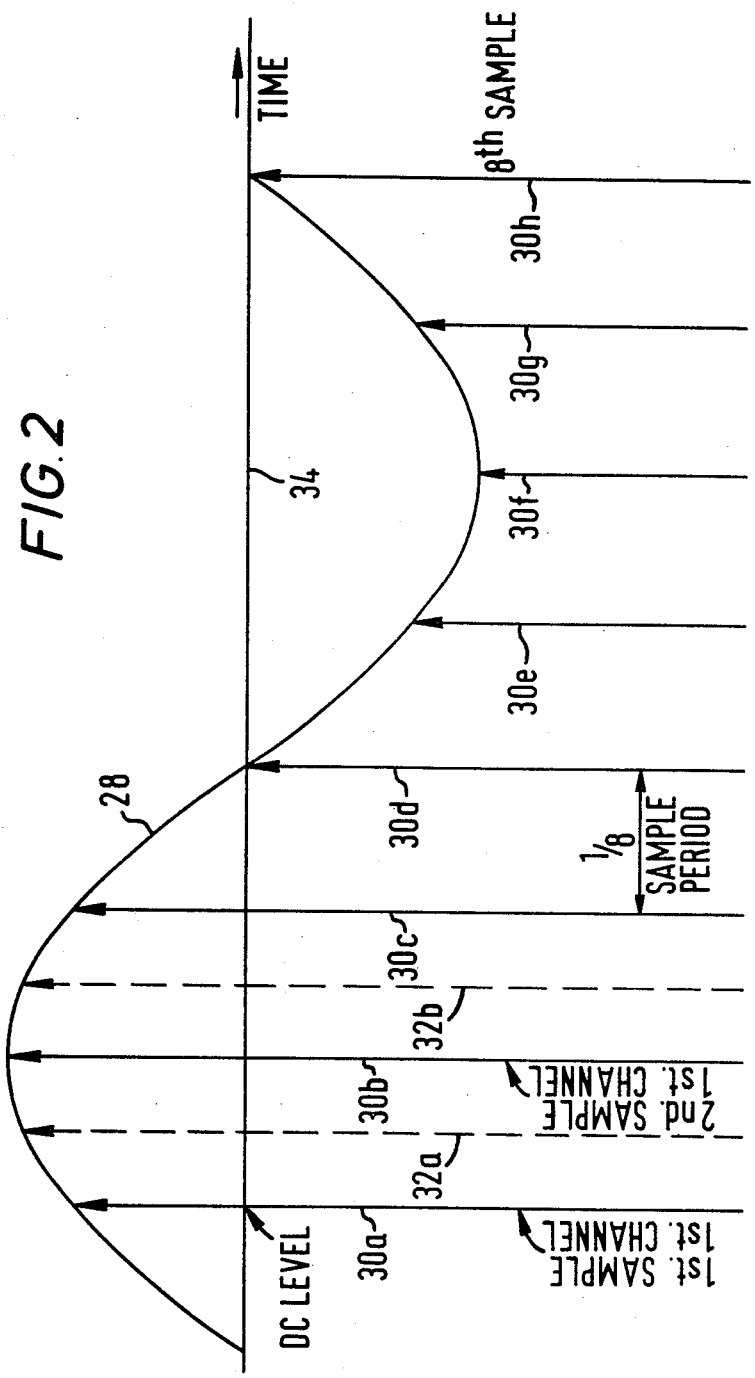

ANALOG TO DIGITAL CONVERTERS FOR CONVERTING A PLURALITY OF DIFFERENT INPUT SIGNALS

FIELD OF THE INVENTION

This invention relates to analog to digital converters and to systems embodying such converters.

DISCLOSURE STATEMENT

The following disclosure statement is made pursuant to the duty of disclosure imposed by law and formulated in 37 CFR 1.56(a). No representation is hereby made that information thus disclosed in fact constitutes prior art, in as much as 37 CFR 1.56(a) relies on a materiality concept which depends on uncertain and inevitably subjective elements of substantial likelihood and reasonableness and in as much as a growing attitude appears to require citation of material which might lead to a discovery of pertinent material though not necessarily being of itself pertinent. Also, the following comments contain conclusions and observations which have only been drawn or become apparent after conception of the subject invention or which contrast the subject invention or its merits against the background of developments which may be subsequent in time or priority.

In the conversion of a d.c. signal to a digital representation therof, the resulting digital value can be in error due to one or more interfering signals. The presence of such interference is well known and various techniques have been devised to alleviate their affects. One type of interference, series (or normal) mode interference can be caused by a.c. signals and that due to mains, or line, supply at 50 Hz or 60 Hz, or harmonics of these frequencies, can substantially reduce the accuracy of the conversion particularly if the d.c. signal to be converted is at a low level (magnitude).

The affect of such a.c. series mode interference (at a particular frequency such as the mains supply frequency) can be eliminated, or greatly reduced, by integrating the input signal, to be converted over one period, for example one period of the mains supply, as the integral of a sine wave over one period is zero.

The dual slope integrating digital voltmeter is a well known example. However using a dual slope analog to digital converter means that the conversion period is necessarily greater than one mains period in the case of mains frequency interference and two mains periods are usually allocated for each conversion.

While this is quite acceptable for single measurements it may not be acceptable, for example, when it is required to convert input signals received from a plurality of different signal sources such as in a data logging system in which the outputs from a plurality of transducers are to be scanned in sequence and their outputs converted to digital signals for display, control purposes or the like. To give a specific example, if say 15 transducers are to be scanned in turn and their outputs converted to digital values by a dual slope analog to digital converter having an integrating period of 20 m secs (for a 50 Hz mains supply), the minimum conversion period, T would be $$T = (2 \times 15 \times 20) \text{ m secs} = 1200 \text{ m secs}$$

The comparatively long conversion period might be unacceptable for various reasons. One way to reduce the conversion time would be to provide a separate converter for each input channel or for selected groups of channels but this would increase costs considerably.

There are also available analog to digital converters with a conversion time very much shorter than that of an integrating converter, and the successive approximations converter is a well known example. However such converters have no inherent ability to reject series mode a.c. interference. Such interference can be reduced by the use of input filters but the conversion time is then extended.

In the course of a novelty search the following patent specifications were noted:

(a) U.S. Pat. No. 4,308,098 (Neuner et al) issued Dec. 29, 1981 discloses an analog to digital converter in which samples of a single analog signal are taken at discrete points over a predetermined period, converted to digital signals and averaged to provide a digital representation of the analog signal. To maximise the noise rejection the specification teaches that the sampling period be made equal to an integral number of cycles of the a.c. power line frequency which results in an extended conversion time.

(b) U.S. Pat. No. 4,305,132 (Tsuboshima et al) issued Dec. 8, 1981, discloses an analog to digital converter in which noise at a known frequency of period T on a single analog signal is eliminated by sampling the analog signal at intervals of T/2, converting the sampled signals to digital form and averaging the two digital signals to provide a digital representation of the analog signal.

(c) U.S. Pat. No. 4,193,118 (Nash et al) issued Mar. 11, 1980, discloses a low pass digital filter in which a composite signal formed by a combination of high frequency and low frequency component waveforms is periodically sampled by an analog to digital converter and a running average of digital signals is derived therefrom. These average signals are updated during a subsequent sample period to provide a series of digital signals of a magnitude such that when plotted against time an approximation of the low frequency component of the composite input signal is obtained.

(d) U.S. Pat. No. 4,192,003 (Brock et al) issued Mar. 4, 1980, discloses means for recovering a generally sinusoidal waveform in which the noise to signal ratio is high. The apparatus includes an analog to digital converter and the waveform is sampled at intervals to provide digital signals to a computer for processing to recover the waveform with a high level of the noise removed.

(e) G.B. Patent Application No. 2 052 193A published Jan. 21, 1981, discloses a data logging apparatus for a vehicle using a known dual ramp or a known boosting charge, constant current discharge (or charge transfer) analog to digital converter. The apparatus is conventional and the invention appears to lie in the use of a computer to correct the converted digital signals according to variations in the supply voltage of the vehicle battery.

(f) The following patent specifications were also noted during a search but not considered relevant:

U.S. Pat. No. 4,070,708 (Smallcombe et al) issued Jan. 24, 1978.

G.B. Pat. No. 2,067,864 (Canon) Application published July 30, 1981.

G.B. Pat. No. 2 042 838 (Siemens) Application published Sept. 24, 1980.

None of the foregoing specifications disclose or suggest apparatus in which a plurality of different input signals can be scanned and sampled sequentially to provide digital representations thereof in a manner according to the present invention.

SUMMARY OF THE INVENTION

According to the invention there is provided an analog to digital converter apparatus for converting analog input signals coupled to a plurality C of inputs to digital representations thereof, comprising means arranged sequentially to couple the C inputs to a fast analog to digital converter at a rate such that each input is coupled to the converter N times in a period M of an a.c. series mode signal and at equal time intervals of M/N, averaging means for averaging the N digital values of each input to provide at the end of a conversion period C digital signals representative of the mean magnitude of the C input signals respectively during a period M.

By "fast analog to digital converter" is meant a converter capable of making a plurality N of conversions during one period of the series mode interfering signal, that is within 20 m secs for a 50 Hz signal. Preferably the converter is a successive-approximations converter.

The averaging means may comprise storage means for storing the individual digital signals at predetermined addresses, means for summing the N samples of each input in sequence and for dividing the sum signal by N to provide the said digital representation.

Preferably N is a value $2^x$ where x is an integer thereby to facilitate the averaging. In a preferred embodiment N is 8 and division by 8 is readily effected, for example, by storing the digital number in a shift register and shifting it three places.

A microcomputer can be used with advantage as part of the apparatus to control the operation thereof.

BRIEF DESCRIPTION OF THE DRAWINGS

The invention will now be descibed by way of example with reference to the accompanying drawings, in which:

FIG. 2 is a waveform diagram illustrating the sampling intervals of the analog to digital converter.

DETAILED DESCRIPTION OF THE DRAWINGS

Figure 1:
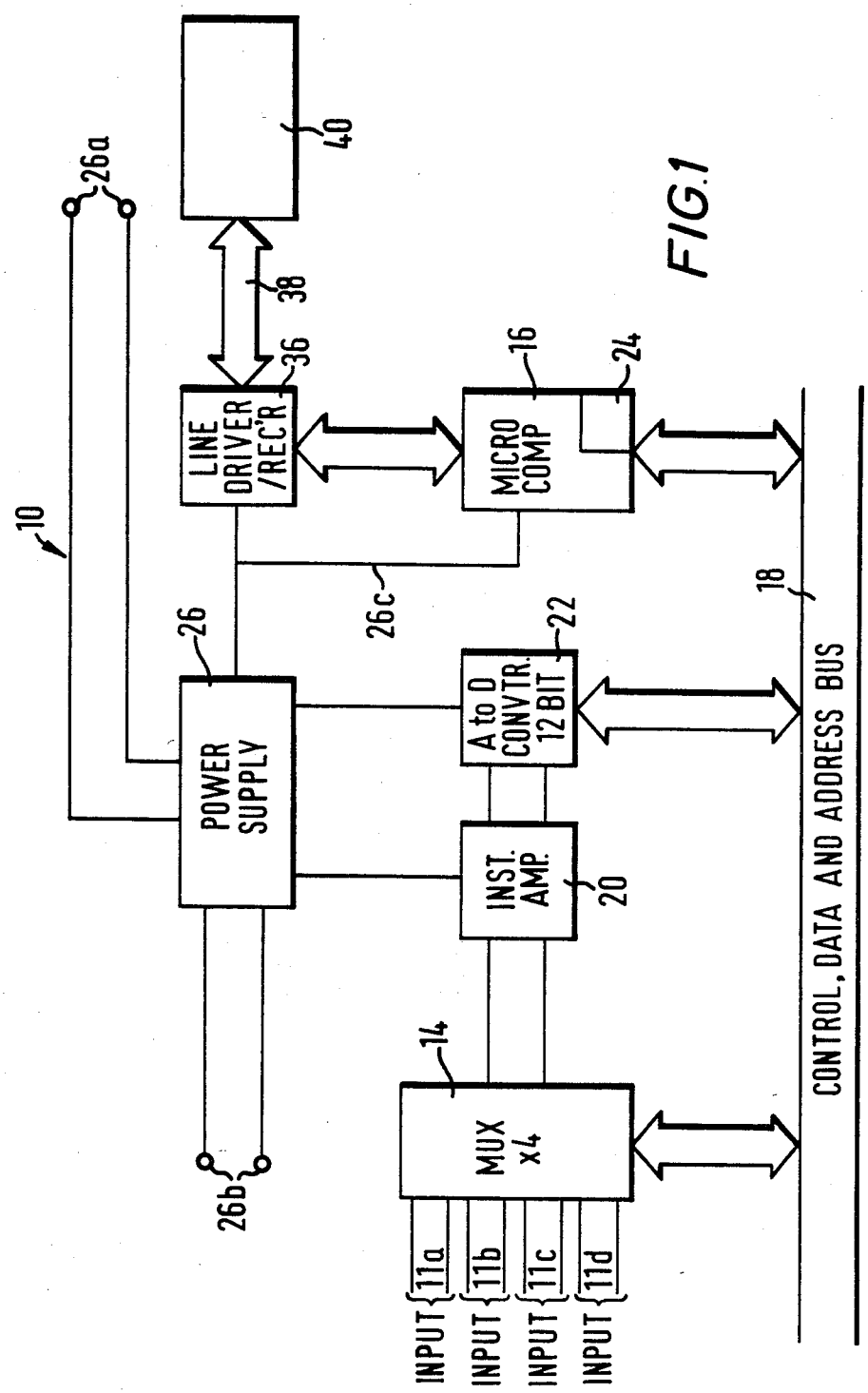
FIG. 1 is a block diagram of one embodiment of the invention arranged to interrogate a plurality of transducers.

Referring to FIG. 1 there is shown apparatus 10 arranged, inter alia, to interrogate a plurality of input channels 11 associated with measurement transducers, such as pressure responsive transducers which provide a d.c. input signal whose level is dependent upon the magnitude of the pressure applied thereto.

In this embodiment, four input channels 11a to 11d are coupled to a multiplexer circuit 14 arranged sequentially to sample each channel 11a to 11d in a manner to be described under the control of a microcomputer 16 which is coupled to various parts of the apparatus by way of a control, data and address bus 18.

The input channels 11 are coupled, in turn, by way of an amplifier 20 to a 12-bit analog to digital converter 22. The digital output signals from the a-to-d converter 22 are coupled by way of the bus 18 to predetermined addresses in a random access memory, RAM, 24 in the microcomputer 16.

A power supply 26 is arranged to receive a 240 volt 50 Hz mains supply coupled to terminals 26a and to provide a d.c. supply for energising the transducers at terminals 26b and the apparatus.

The microprocessor 16 is also arranged to receive the 50 Hz alternating signal on line 26c and to derive a square wave signal therefrom which is used to control the timing of the apparatus. For example, for a 50 Hz sine wave input it will produce a 20 m secs signal but its duration will vary with any variation of the mains frequency from its nominal value of 50 Hz. The 20 m sec signal is then divided down into four (C=4) sets of equispaced control signals such that each channel 11 is coupled to the a-to-d converter 8 times (N=8) in each period M (nominally 20 m secs) of the mains supply.

At the end of a period M, the eight digital values of an input signal are read from their addresses in the RAM 24, summed and then divided by eight to obtain the average of the input C over the period M. This is performed in and under the control of the microcomputer 16 in any convenient manner. For example, the summed signal can be held in a shift register and shifted three places to effect division by eight in known manner. Thus all four of the input signals can be averaged in this manner.

This is illustrated in FIG. 2 which shows one cycle 28 of the 50 Hz mains supply. The eight full arrows 30a to 30h show the moments in time that the first input signal 11a is interrogated by the multiplexer 14 and converted to a digital signal by the a-to-d converter 22.

Likewise the broken arrows 32a and 32b show the first two of eight similar samples taken of the fourth input signal 11d, the other samples being taken in similar time spaced relation to the samples of the signal 11a, the signals 11b and 11c will be taken at similar equispaced intervals M/N intermediate the samples 30 and 32.

It can be shown and it will become apparent from a study of FIG. 2 that by taking 8 equal spaced samples (nominally at 20÷8=2.5 m secs) that the affect of the a.c. series mode interference signal 28 on the d.c. lever 34 is cancelled, the positive-going samples 30a, 30b, 30g, 30h cancelling the negative-going samples 30c, 30d, 30e, 30f of input signal 11a.

Similar cancellation of the series mode interference due to the mains supply will take place on the samples of all other input signals. It can be shown that if the phase of all of the samples of an input signal is shifted by the same amount then the cancellation will still be effective.

It has been found that if N samples are taken in a period M of the a.c. series mode interfering signal all harmonics up to the (N−1) harmonic of the interfering signal are cancelled, provided the sample timing is accurate.

Taking the original example of 15 input channels, it is possible to sample all of the channels in one mains period and complete the analog to digital conversion in the next period, that is in 2×20=40 m secs as opposed to 1200 m secs in the example using an integrating converter.

Thus there has been described an a-to-d converter system combining the advantages of the speed of conversion of a fast converter such as a successive approximations a-to-d converter with the good series mode rejection properties usually associated with a slow integrating a-to-d converter such as a dual slope a-to-d converter.

The digital signals can be stored in the RAM 24 and used as required. In FIG. 1 the microcomputer 16 is shown coupled to a line driver/receiver 36 coupled to a highway 38, such as a serial RS 232 network and the digital outputs representative of the inputs 11 can be used for example for control purposes, to drive a utilisation device 40 such as a display device, printer and so on.

We claim:

1. Analog to digital converter apparatus for converting analog input signals coupled to a plurality C of inputs to digital representations thereof, comprising a fast analog to digital converter having an input and an output, means arranged sequentially to couple the C inputs to the analog to digital converter at a rate such that each input is coupled to the converter N times in a period M of an a.c. series mode signal and at equal time intervals of M/N, averaging means having an input coupled to the output of the analog to digital converter for averaging the N digital values of each input to provide at the end of a conversion period C digital signals representative of the mean magnitude of the C input signals respectively during a period M.

2. Analog to digital converter apparatus according to claim 1, in which the analog to digital converter is a successive-approximations converter.

3. Analog to digital converter apparatus according to claim 1, in which the averaging means comprises storage means for storing the individual signals at predetermined addresses, means for summing the N samples of each input in sequence and for dividing the sum signal by N to provide the said digital representation.

4. Analog to digital converter apparatus according to claim 3, in which N is a value $2^x$ where x is an integer.

5. Analog to digital converter apparatus according to claim 4, in which N is 8 and division by 8 is effected by storing the digital number in a shift register and shifting it three places.

* * * * *